(12) United States Patent
Wu et al.

(10) Patent No.: US 8,084,757 B2
(45) Date of Patent: Dec. 27, 2011

(54) CONTAMINATION PREVENTION IN EXTREME ULTRAVIOLET LITHOGRAPHY

(75) Inventors: Banqiu Wu, Sunnyvale, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 367 days.

(21) Appl. No.: 12/015,984

(22) Filed: Jan. 17, 2008

(65) Prior Publication Data
US 2009/0186282 A1 Jul. 23, 2009

(51) Int. Cl.
*H05H 1/00* (2006.01)
(52) U.S. Cl. .............. 250/504 R; 372/87; 378/119
(58) Field of Classification Search .......... 250/504 R
See application file for complete search history.

(56) References Cited

U.S. PATENT DOCUMENTS

| | | | |
|---|---|---|---|
| 4,652,318 A * | 3/1987 | Masuda et al. | 156/89.19 |
| 5,991,360 A * | 11/1999 | Matsui et al. | 378/119 |
| 6,498,351 B1 | 12/2002 | Kruizinga et al. | |
| 6,526,997 B1 | 3/2003 | Henley | |
| 6,534,775 B1 * | 3/2003 | Harrington et al. | 250/492.21 |
| 6,566,169 B1 | 5/2003 | Uziel et al. | |
| 6,753,941 B2 | 6/2004 | Visser | |
| 6,829,035 B2 | 12/2004 | Yogev | |
| 6,972,420 B2 * | 12/2005 | Silverman | 250/492.2 |
| 7,057,190 B2 | 6/2006 | Bakker et al. | |
| 7,126,671 B2 | 10/2006 | Cox et al. | |
| 7,167,232 B2 | 1/2007 | Banine et al. | |
| 7,193,683 B2 | 3/2007 | Hazelton et al. | |
| 7,230,258 B2 | 6/2007 | Ruzic et al. | |
| 7,251,013 B2 | 7/2007 | Ten Kate et al. | |
| 7,277,158 B2 | 10/2007 | Dierichs | |
| 2003/0071979 A1 | 4/2003 | Visser | |
| 2005/0051421 A1 | 3/2005 | Quesnel et al. | |
| 2005/0242300 A1 | 11/2005 | Silverman | |
| 2007/0229944 A1 | 10/2007 | Lee et al. | |
| 2007/0235666 A1 | 10/2007 | Ruzic et al. | |

OTHER PUBLICATIONS

PCT International Search Report and Written Opinion dated Aug. 26, 2009 for International Application No. PCT/US2009/030209.

* cited by examiner

*Primary Examiner* — Phillip A Johnston
(74) *Attorney, Agent, or Firm* — Patterson & Sheridan, L.L.P.

(57) ABSTRACT

Embodiments of the present invention provide methods and apparatus for removing debris particles using a stream of charged species. One embodiment of the present invention provides an apparatus for removing debris particles from a beam of radiation comprising a charged species source configured to dispense electrically charged species, and a collecting plate biased electrically opposite to the charged species from the charged species source, wherein the collecting plate and the charged species source are disposed on opposite sides of the beam of radiation, a stream of charged species from the charged species source to the collecting plate intersects the beam of radiation, the stream of charged species is configured to attach and remove debris particles from the beam of radiation by electrostatic force, and the collecting plate is configured to receive the charged species and the debris particles removed from the beam of radiation.

17 Claims, 3 Drawing Sheets

CONTAMINATION PREVENTION IN EXTREME ULTRAVIOLET LITHOGRAPHY

BACKGROUND

1. Field

Embodiments of the present invention generally relate to methods and apparatus for preventing particle contamination. Particularly, embodiments of the present invention provide methods and apparatus for protecting masks and/or substrates during lithography.

2. Description of the Related Art

As the trend continues to reduce the size of semiconductor devices, optical lithography using conventional transmission masks, such as chrome on glass (COG) or phase shift (PSM) masks, will no longer suffice as a viable technique for printing advanced devices on semiconductor wafers. Transmission lithography has been extended to ever shorter wavelengths, down to 157 nm in the far ultraviolet (UV), in order to reduce the size of device features. However, the still shorter wavelengths necessary for printing even smaller device structures are readily absorbed in transmission materials. Alternative technological candidates to replace optical lithography include: electron projection lithography (EPL) and an all-reflective technology called extreme ultra-violet lithography (EUVL).

Generally, masks used in production today employ a pellicle to protect the mask surface from particulate contamination. The pellicle is a relatively inexpensive, thin, transparent, flexible sheet, which is stretched above and not touching the surface of the mask. Pellicles provide a functional and economic solution to particulate contamination by mechanically separating particles from the mask surface. The mask is transported and used for lithographic exposure with the pellicle in place. When a mask is used for exposure, with the pellicle in position above the mask, only the details of the mask's focal plane itself are printed. Particulate material located on the pellicle surface is maintained outside of the focal plane of projection. As a result, particulate material is not printed. When the pellicle eventually becomes damaged or too dirty to use, the mask is removed to a workshop, and the pellicle is replaced.

However, in EUV lithography, conventional pellicles can not be used to protect masks during process because all materials are opaque to EUV light. Even though, masks may be protected by pellicles when not in use. Masks must be exposed during lithography. Additionally, the minimum particle size to be removed has decreased with the decrease of the wavelength of the radiation source. For example, in EUV lithography for 65 nm features, particles as small as 52 nm must be removed.

Therefore, there is a need for apparatus and methods for protecting masks during lithography.

SUMMARY

Embodiments of the present invention generally provide apparatus and methods for removing particle contamination during lithography. Particularly, embodiments of the present invention provide methods and apparatus for removing debris particles using a stream of charged species.

One embodiment of the present invention provides an apparatus for removing debris particles from a beam of radiation. The apparatus comprises a charged species source configured to dispense electrically charged species, and a collecting plate biased electrically opposite to the charged species from the charged species source. The collecting plate and the charged species source are disposed on opposite sides of the beam of radiation. A stream of charged species from the charged species source to the collecting plate intersects the beam of radiation. The stream of charged species is configured to attach and remove debris particles from the beam of radiation by electrostatic force. The collecting plate is configured to receive the charged species and the debris particles removed from the beam of radiation.

Another embodiment of the present invention provides an apparatus for lithography. The apparatus comprises a radiation source configured to provide a beam of radiation, a mask holder configured to support a mask during process, a substrate stage configured to support and index a substrate being processed, a projection system configured to project the beam of radiation from the mask to the substrate, and a particle removal station disposed in the path of the beam of radiation. The mask receives and reflects the beam of radiation. The particle removal station comprises a charged species source configured to dispense electrically charged species. The particle removal station further comprises a collecting plate biased electrically opposite to the charged species from the charged species source, wherein the collecting plate and the charged species source are disposed on opposite sides of the beam of radiation. A stream of charged species from the charged species source to the collecting plate intersects the beam of radiation. The stream of charged species is configured to attach and remove debris particles from the beam of radiation by electrostatic force. The collecting plate is configured to receive the charged species and the debris particles removed from the beam of radiation.

Yet another embodiment of the present invention provides a method for removing debris particles in a beam of radiation. The method comprises providing a charged species source, providing a collecting plate so that a path between the collecting plate and the charged species source intersects the beam of radiation, charging the collecting plate with electrical potential opposite to charged species from the charged species source, and removing the debris particles from the beam of radiation by flowing a stream of charged species from the charged species source to the collecting plate. In the present embodiment, the charged species in the stream of charged species attracts the debris particles using electrostatic force, and carries the debris particles to the collecting plate.

BRIEF DESCRIPTION OF THE DRAWINGS

So that the manner in which the above recited features of embodiments of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide apparatus and method for preventing particle contamination during lithography. Particularly, embodiments of the present invention provide methods and apparatus for removing debris particles from a beam of radiation during photolithography.

In one embodiment, a charged species source and a collecting plate are disposed on opposite sides of a beam of radiation used in lithography. The charged species source is configured to project a stream of charged species and the collecting plate is configured to receive the stream of charged species from the charges species source. The stream of the charged species is configured to intersect the beam of radiation, and to use electrostatic force to remove debris particles from the beam of radiation, thus, preventing the debris particles from contaminating the mask, the substrate being processed, and any devices in the path of the beam of radiation. The charged species source and the collecting plate may be positioned in front of a mask holder, any mirrors, or a radiation source.

Figure 1:
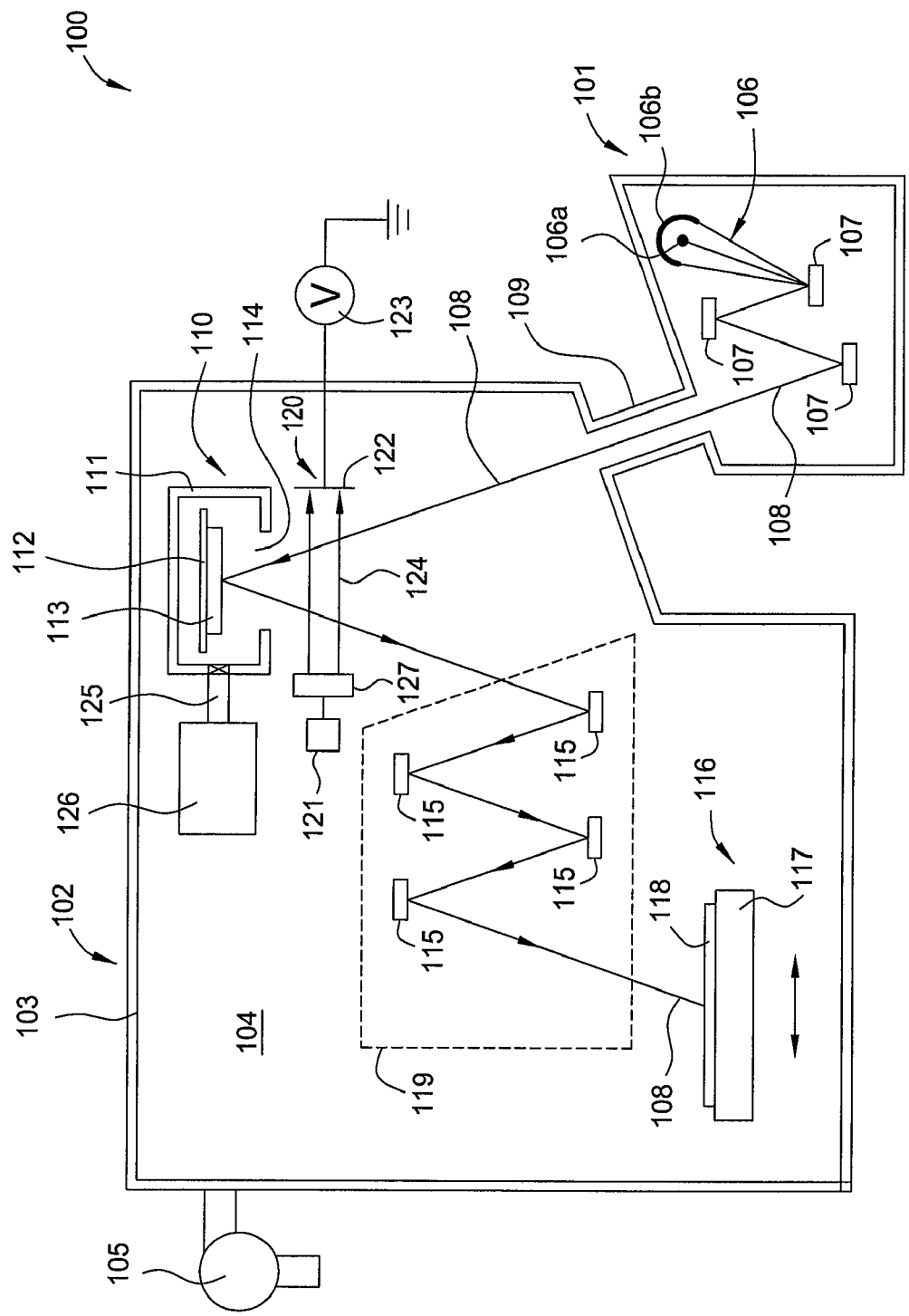
FIG. 1 schematically illustrates a lithography system in accordance with one embodiment of the present invention.

FIG. 1 schematically illustrates a lithography system 100 in accordance with one embodiment of the present invention.

The lithography system 100 generally comprises a radiation system 101 configured to generate a beam of radiation 108 to be used in lithography. The lithography system 100 further comprises a lithography apparatus 102 in connection with the radiation system 101 via a wave train 109.

The radiation system 101 generally comprises a radiation source 106 and a projection system 107. In one embodiment, the radiation source 106 may comprise a laser produced plasma 106a and a collection mirror 106b. In one embodiment, the radiation system 101 may be configured to generate extreme ultraviolet (EUV) radiation with a wavelength in the range of 5 nm to 20 nm.

The radiation system 101 is configured to project a beam of radiation 108 towards the lithography apparatus 102 for a lithographic process.

The lithography apparatus 102 comprises a body 103 defining an inner volume 104. During process, the inner volume 104 may be vacuumed using a pumping system 105 as processing in a vacuum state is a typical method to prevent particle contamination. The lithography apparatus 102 further comprises a mask station 110, a projection system 119, a substrate stage 116, and a particle removal station 120, which are disposed in the inner volume 104.

The mask station 110 is configured to precisely position a mask 113 which is configured to receive and reflect the beam of radiation 108 to the projection system 119. The mask 113 has a pattern formed thereon and the pattern is reflected in the beam of radiation 108 reflected from the mask 113. The projection system 119 is configured to project the beam of radiation 108 and convey the pattern to a substrate 118 positioned on the substrate stage 116 which is configured to precisely position the substrate 118. The particle removal station 120 is disposed on a path of the beam of radiation 108 and configured to remove any debris particles travelling with the beam of radiation 108. In one embodiment, the particle removal station 120 is positioned near the mask station 110 intersecting the input and output path of the beam of radiation 108 to and from the mask 113.

The mask station 110 generally comprises a chamber body 111 having a shutter opening 114 configured to transmit the beam of radiation 108 during processing. The mask 113 is positioned on a mask stage 112 which is configured to precisely position the mask 113 to align with the beam of radiation 108 and the projection system 119. In case of EUV lithography, the mask 113 is directly exposed to the beam of radiation 108 and the ambient of the inner volume 104 without any protection because all materials are opaque to EUV wavelength. However, an optional shutter may be disposed in the shutter opening 114 and be closed while not processing.

The mask station 110 may further comprise a mask transfer mechanism 125 configure to transfer the mask 113 to and from a mask storage 126, where different masks may stored in a sealed condition.

The projection system 119 generally comprises a plurality of mirrors 115 configured to reflect the beam of radiation 108 towards the substrate 118. The projection system 119 may comprise up to 11 mirrors. The projection system 119 may comprise a projecting column (not shown) configured to project the beam of radiation 108 from the plurality of mirrors 115 to the substrate 118 at a desired ratio and a desired location.

The substrate stage 116 generally comprises a substrate support 117 which is configured to support, translate and rotate the substrate 118 to enable the beam of radiation 108 to be projected to a plurality of dies.

The particle removal station 120 is configured to remove any debris particles travelling within the beam of radiation 108 to protect the mask 113, the mirrors 115 and the substrate 118. The particle removal station 120 may be positioned anywhere in the path of the beam of radiation 108.

Figure 2:
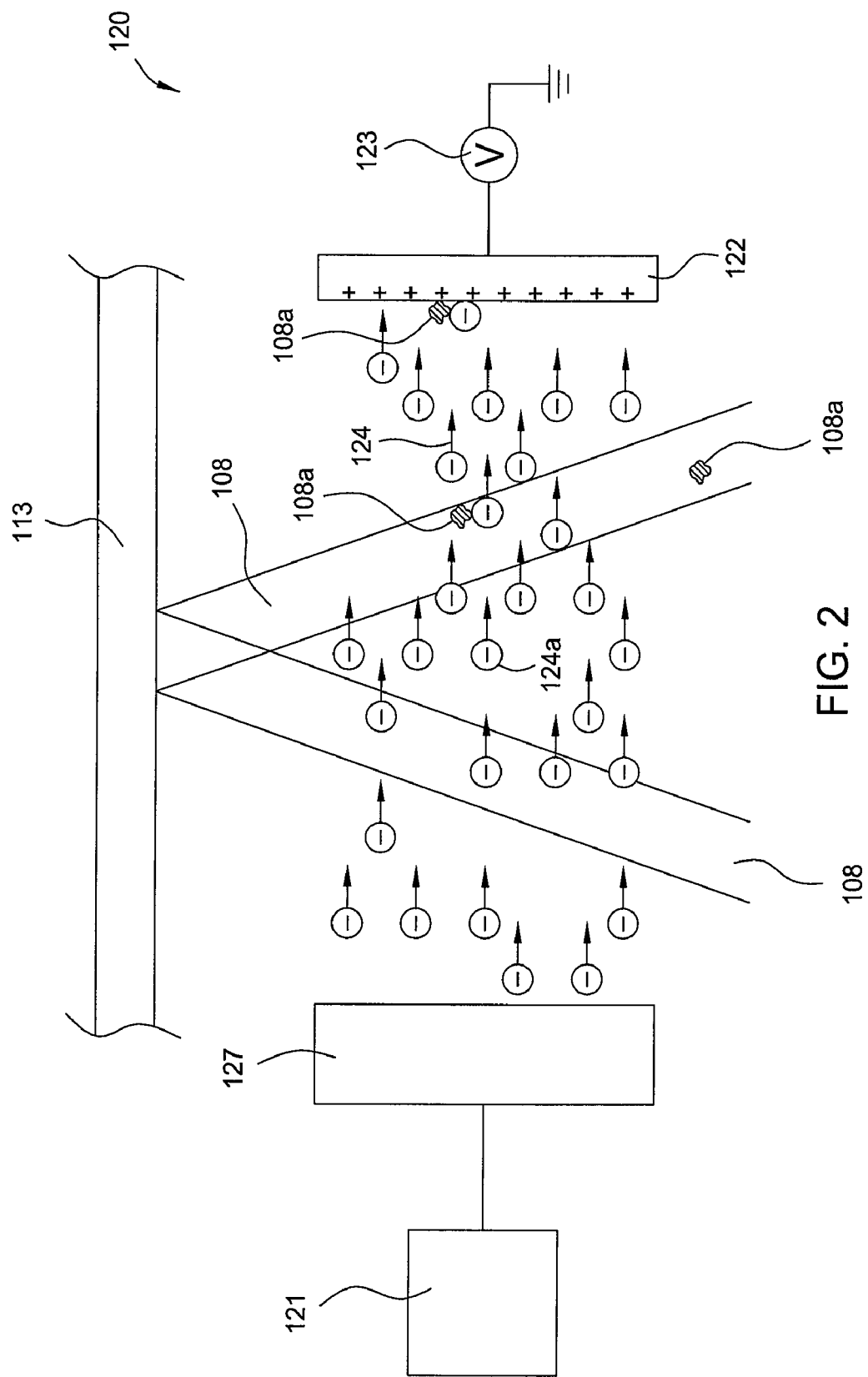
FIG. 2 schematically illustrates an enlarged view of a particle removal station of the lithography system of FIG. 1.

FIG. 2 schematically illustrates an enlarged view of the particle removal station 120 of FIG. 1. The particle removal station 120 generally comprises a charged species source 127 and a collecting plate 122. The charged species source 127 is connected to a power source 121 and is configured to generate a stream of charged species 124 comprising charged species 124a. The collecting plate 122 is connected to a potential source 123 and is charged with charges opposite to the charged species 124a. The stream of charged species 124 is attracted to and collected by the collecting plate 122 without affecting other devices, such as optics in the system, that are sensitive to electric field.

During processing, the particle removal station 120 may be positioned in a way such that the collecting plate 122 and the charged species source 127 are on opposite sides of the beam of radiation 108. The stream of charged species 124 is configured to intersect the beam of radiation 108 and to "grab" debris particles 108a presented in the beam of radiation 108 using electrostatic force. The grabbed debris particles 108a then travel with the stream of charged species 124 and are collected by the collecting plate 122.

The charged species 124a may be electrons, ions of positive or negative changes. In one embodiment, the charge species source 127 may be a corona charge generator, a thermal emitter, or an ion generator. The collecting plate may be charged at a potential between about 200 volts to about 400 volts.

Although only one particle removal station 120 is described in the lithography system 100, more similar particle removal stations may be positioned in suitable positions, such as in front of any mirrors 115, and within the radiation source 101.

Figure 3:
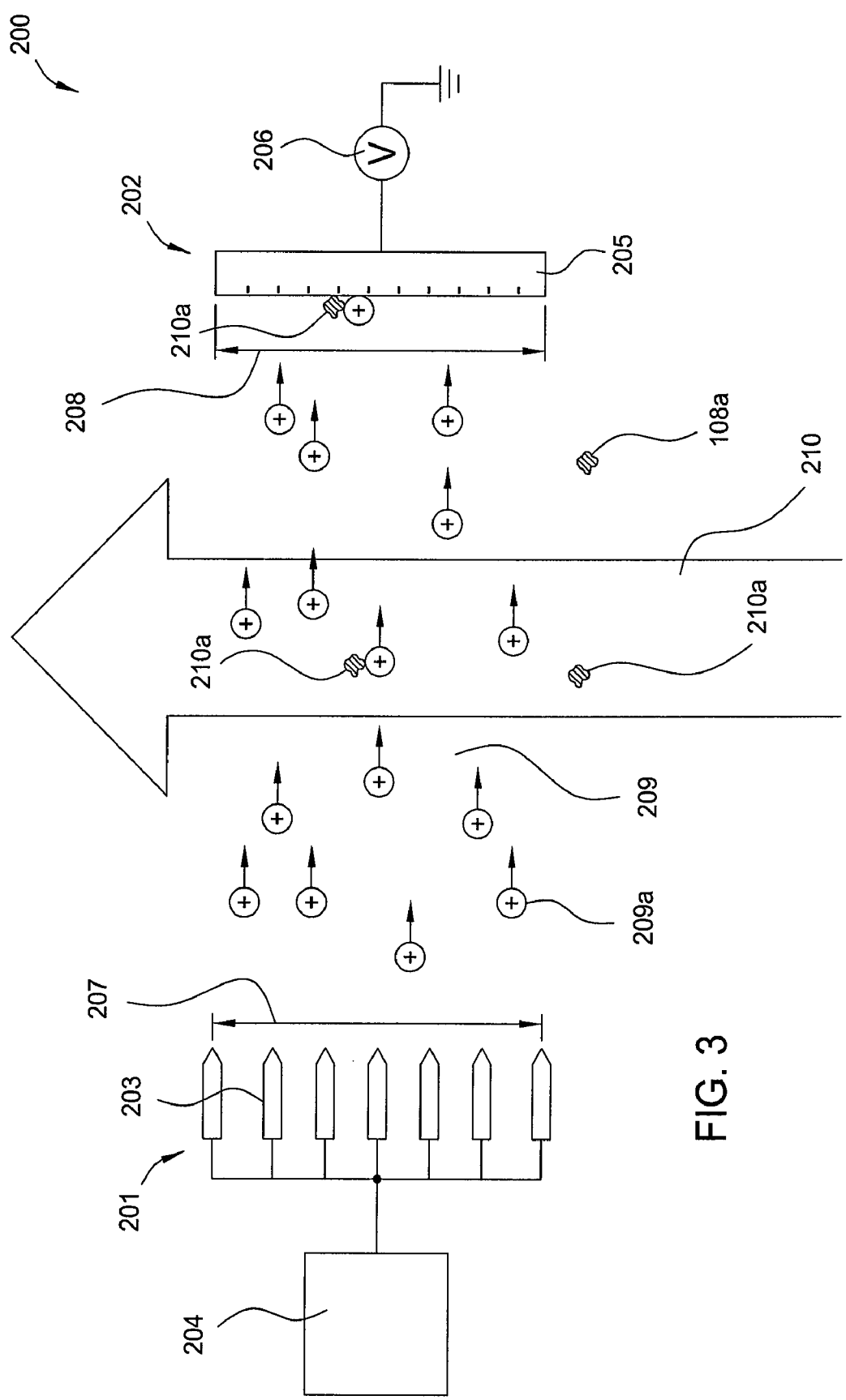
FIG. 3 schematically illustrates a particle removal station in accordance with one embodiment of the present invention.

FIG. 3 schematically illustrates a particle removal station 200 in accordance with one embodiment of the present invention. The particles removal station 200 is configured to remove particle contaminations using electrostatic force and may be used in a lithography system, such as the particle removal station 120 in FIG. 1.

The particle removal station 200 generally comprises a charged species source assembly 201 and a collecting assembly 202.

The charged species source assembly 201 comprises a plurality of electrodes 203 connected to a power source 204. Each of the plurality of electrodes 203 is configured to discharge charged species 209a. The charged species 209a may be electrons or ions of positive or negative charges. In one embodiment, the plurality of electrodes 203 may be point or line electrodes positioned in a parallel manner. In one embodiment, the plurality of electrodes 203 may form a column having a diameter 207 of about 5 mm to 20 mm. The plurality of electrodes 203 collectively generate a stream of charged species 209.

The collecting assembly 202 comprises a collecting plate 205 connected to a power source 206. The collecting plate 205 is generally a conductive plate and the power source 206 is configured to charge to collective plate 205 with charges opposite to the charges of the charged species 209a. The collecting plate may be charged at a potential between about 200 volts to about 400 volts. In one embodiment, the collecting plate 205 may have a diameter 208 slightly larger than the diameter 207 of the electrode column of the charged species source assembly 201. In one embodiment, the collecting plate 205 may have a diameter 208 of about 5 mm to about 20 mm.

The stream of charged species 209 is configured to intersect with a beam of radiation 210 and to "grab" any debris particles 210a travelling in the beam of radiation 210 using electrostatic force. The grabbed debris particles 210a then travel with the stream of charged species 209 and are collected by the collecting plate 205.

Even though only lithography process is described in accordance with the present invention, embodiments of the present invention may be applied to any suitable process and in any suitable processing tools that requires removal of particle contamination in a path of energy or fluid transmission.

While the foregoing is directed to embodiments of the present invention, other and further embodiments of the invention may be devised without departing from the basic scope thereof, and the scope thereof is determined by the claims that follow.

What is claimed is:

1. An apparatus for removing debris particles from a beam of radiation, comprising:
    a charged species source configured to dispense electrically charged species, wherein the charged species source uses a thermal emitter to generate a beam of electrons; and
    a collecting plate biased electrically opposite to the electrons from the charged species source, the charged species source and the collecting plate are disposed within a vacuum lithography apparatus,
    wherein the collecting plate and the charged species source are disposed on opposite sides of the beam of radiation and arranged such that a stream of electrons from the charged species source to the collecting plate intersects the beam of radiation, the stream of electrons is configured to attract and remove debris particles from the beam of radiation by electrostatic force, and the debris particles removed from the beam of radiation travel with the stream of electrons and are collected and retained on the collecting plate.

2. The apparatus of claim 1, wherein the beam of radiation is a beam of extreme ultraviolet waves.

3. The apparatus of claim 1, wherein the collecting plate is biased by about 200 volts to about 400 volts.

4. The apparatus of claim 1, wherein the charged species source comprises a plurality of line electrodes disposed in a parallel manner along the path of the beam of radiation or a plurality of point electrode disposed in a line parallel to the path of the beam of the radiation.

5. The apparatus of claim 4, wherein the plurality of electrodes are distributed in a column having a diameter between about 5 mm to about 20 mm.

6. The apparatus of claim 5, wherein the collecting plate has a diameter larger than the diameter of the column formed by the plurality of electrodes.

7. An apparatus for lithography, comprising:
    a radiation source configured to provide a beam of radiation;
    a mask holder configured to support a mask during process, wherein the mask receives and reflects the beam of radiation;
    a substrate stage configured to support and index a substrate being processed;
    a projection system configured to project the beam of radiation from the mask to the substrate; and
    a particle removal station disposed in the path of the beam of radiation, the particle removal station comprises:
        a charged species source configured to dispense electrically charged species, wherein the charged species source uses a thermal emitter to generate a beam of charged species, and the charged species are electrons; and
        a collecting plate biased electrically opposite to the charged species from the charged species source, the charged species source and the collecting plate are disposed within a vacuum lithography apparatus,
        wherein the collecting plate and the charged species source are disposed on opposite sides of the beam of radiation and arranged such that a stream of charged species from the charged species source to the collecting plate intersects the beam of radiation, the stream of charged species is configured to attract and remove debris particles from the beam of radiation by electrostatic force, and the debris particles removed from the beam of radiation travel with the stream of charged species and are collected and retained on the collecting plate.

8. The apparatus of claim 7, wherein the radiation source is configured to generate an extreme ultraviolet beam.

9. The apparatus of claim 7, wherein the particle removal station is disposed near the mask holder.

10. The apparatus of claim 9, wherein the stream of charged species intersects with the beam of radiation coming into and coming out from the mask.

11. The apparatus of claim 7, wherein the projection system comprises a plurality of reflection mirrors, and the particle removal station is disposed near one of the plurality of reflection mirrors.

12. The apparatus of claim 7, wherein the collecting plate is biased by about 200 volts to about 400 volts.

13. The apparatus of claim 7, wherein the charged species source comprises a plurality of line electrodes disposed in a parallel manner along the path of the beam of radiation or a plurality of point electrode disposed in a line parallel to the path of the beam of the radiation.

14. A method for removing debris particles in a beam of radiation, comprising:
    providing within a vacuum lithography apparatus a charged species source configured to generate electrons, wherein the charged species source uses a thermal emitter to generate a beam of electrons;

providing within the vacuum lithography apparatus a collecting plate so that a path between the collecting plate and the charged species source intersects the beam of radiation;

charging the collecting plate with electrical potential opposite to electrons; and removing the debris particles from the beam of radiation by flowing a stream of electrons from the charged species source to the collecting plate, wherein the electron in the stream of electrons attracts the debris particles by electrostatic force and travels with the debris particles to the collecting plate, and the debris particles are collected and retained on the collecting plate.

15. The method of claim 14, wherein the collecting plate is charged with an electrical potential about 200 volts to about 400 volts.

16. The method of claim 14, wherein the charged species source comprises a plurality of point electrodes.

17. The method of claim 14, wherein the beam of radiation is a beam of extreme ultraviolet waves.

* * * * *